US006944052B2

United States Patent
Subramanian et al.

(10) Patent No.: US 6,944,052 B2
(45) Date of Patent: Sep. 13, 2005

(54) MAGNETORESISTIVE RANDOM ACCESS MEMORY (MRAM) CELL HAVING A DIODE WITH ASYMMETRICAL CHARACTERISTICS

(75) Inventors: Chitra K. Subramanian, Austin, TX (US); Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 81 days.

(21) Appl. No.: 10/304,625

(22) Filed: Nov. 26, 2002

(65) Prior Publication Data

US 2004/0100817 A1 May 27, 2004

(51) Int. Cl.$^7$ ............................................... G11C 11/14
(52) U.S. Cl. ....................................... 365/171; 365/173
(58) Field of Search ................................ 365/171, 173, 365/232, 158

(56) References Cited

U.S. PATENT DOCUMENTS

| 6,256,247 B1 | 7/2001 | Perner |
| 6,259,644 B1 | 7/2001 | Tran |
| 6,331,944 B1 | 12/2001 | Monsma |

2002/0114112 A1 * 8/2002 Nakashio et al. ........ 360/324.2

OTHER PUBLICATIONS

Zhang et al., "A Novel Self–Aligned Bidirectional MIM Diode with Transparent Junctions for AM–LCD's," IEEE Electron Device Letters, vol. 19, No. 6, Jun. 1998, pp. 192–194.

* cited by examiner

Primary Examiner—Vu A. Le
(74) Attorney, Agent, or Firm—James L. Clingan, Jr.; David G. Dolezal

(57) ABSTRACT

In a magnetoresistive random access memory (MRAM), a magnetic tunnel junction (MTJ) (54) cell is stacked with an asymmetric tunnel device (56). This device, when used in a crosspoint MRAM array, improves the sensing of the state or resistance of the MTJ cells. Each MTJ cell has at least two ferromagnetic layers (42, 46) separated by an insulator (44). The asymmetric tunnel device (56) is electrically connected in series with the MTJ cell and is formed by at least two conductive layers (48, 52) separated by an insulator (50). The asymmetric tunnel device may be a MIM (56), MIMIM (80) or a MIIM (70). Asymmetry results from conducting electrons in a forward biased direction at a significantly greater rate than in a reversed biased direction. Materials chosen for the asymmetric tunnel device are selected to obtain an appropriate electron tunneling barrier shape to obtain the desired rectifying current/voltage characteristic.

18 Claims, 3 Drawing Sheets

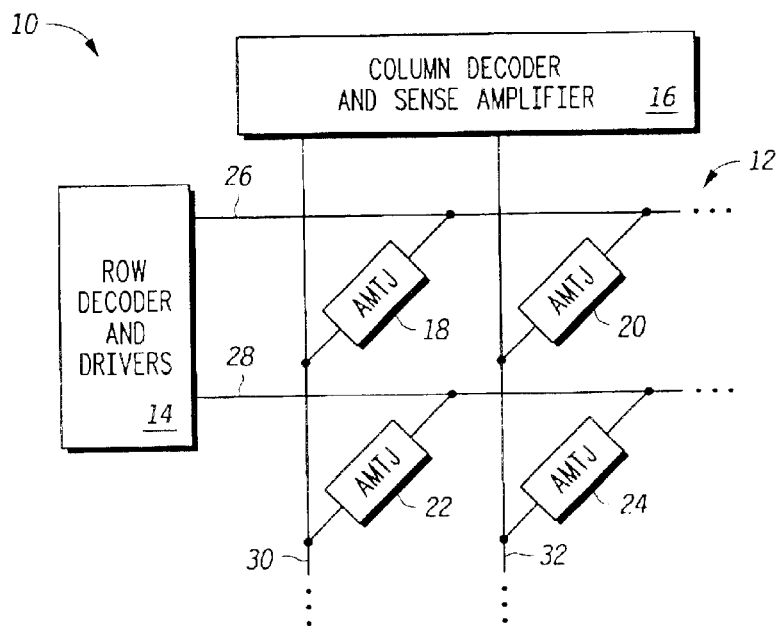
*FIG.1*
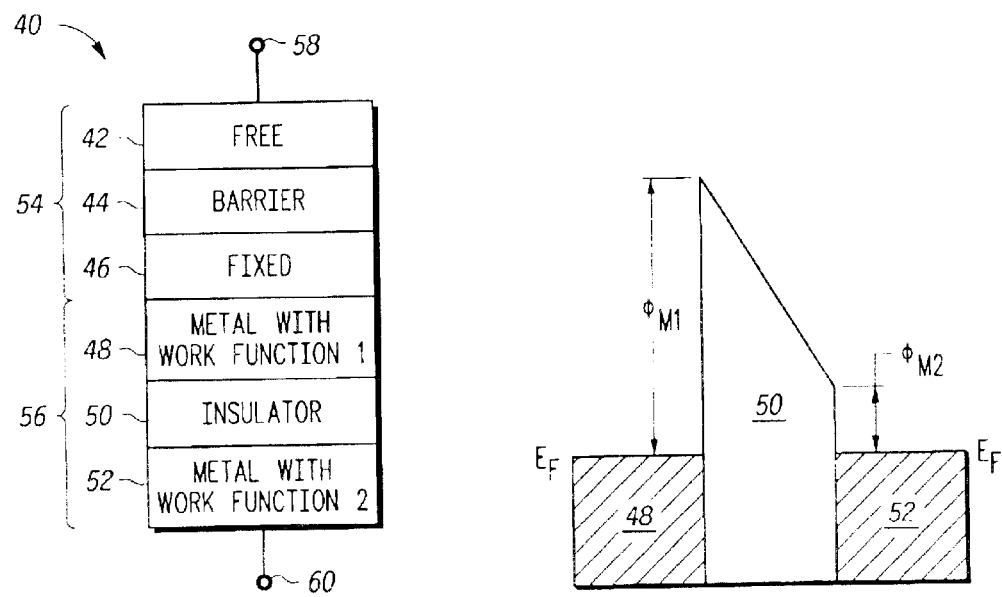
*FIG.2*  *FIG.3*

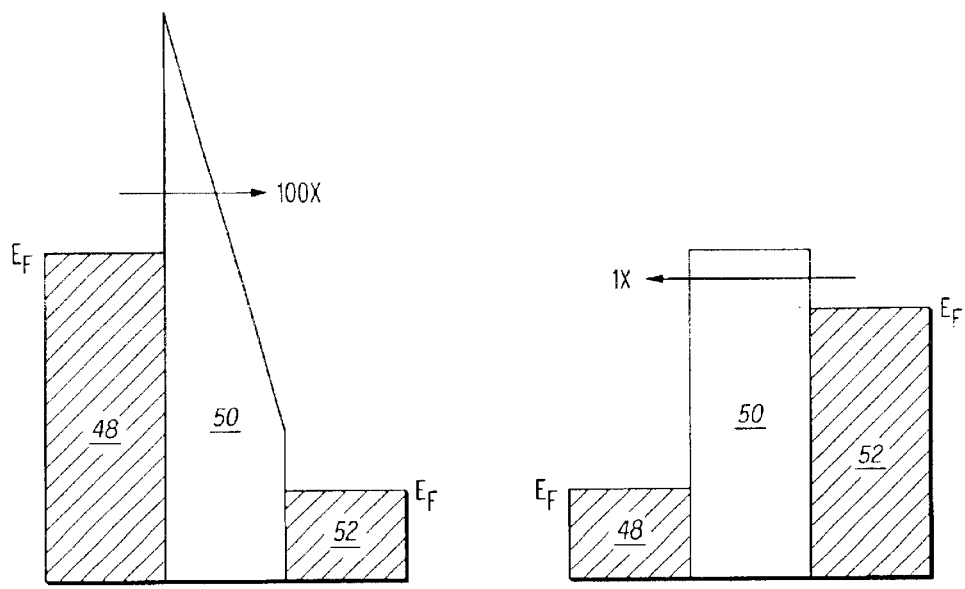
FIG.4            FIG.5
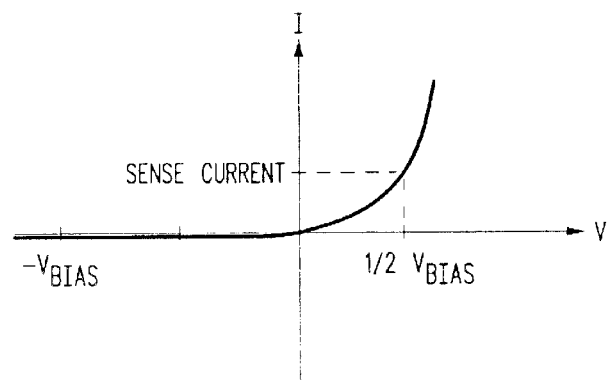
FIG.6

US 6,944,052 B2

MAGNETORESISTIVE RANDOM ACCESS MEMORY (MRAM) CELL HAVING A DIODE WITH ASYMMETRICAL CHARACTERISTICS

FIELD OF THE INVENTION

The invention relates to magneto-resistive random access memories (MRAMs), and more particularly to MRAM cells having a diode.

RELATED ART

MRAMs are attractive due to being non-volatile and relatively high speed. In any memory, especially large memories, cell density is a significant issue. A smaller cell results in a smaller array for a given memory size. The smaller array results in less area being occupied, which in turn, results in lower cost. One of the higher density memories is constructed by simply connecting the cell, which is the magnetic tunnel junction (MTJ), between the word line and the bit line. This type of memory is known to be dense, but difficulties with being able to provide enough sense signal differentiation in the light of the many alternative current paths in the deselected cells has made such memories difficult to manufacture on a commercial basis.

One technique to overcome this has been to use a non-linear device in series with the MTJ. The non-linear device provides a first current level at one voltage, but significantly less than half this current at half the voltage. The intent is for this non-linear device to operate in the higher current regime for the selected cells and the lower current regime for the unselected cells. One of the difficulties of this approach is obtaining sufficient non-linearity to provide a sufficient current differential between the selected and unselected cells.

Thus, there is a need to provide a high density memory array that provides improved margin between the selected and unselected cells.

BRIEF DESCRIPTION OF THE DRAWINGS

The present invention is illustrated by way of example and not limited by the accompanying figures, in which like references indicate similar elements, and in which:

FIG. 1 is a block diagram of a memory for using one of the memory cell types according to various embodiments of the invention;

FIG. 2 is a cross section of a memory cell useful in the memory of FIG. 1 according to a first embodiment of the invention;

FIGS. 3–5 are barrier height diagrams helpful in understanding the operation of the memory cell of FIG. 2;

FIG. 6 is a graph of current versus voltage showing the asymmetric property of the memory cell of FIG. 2;

Figure 7:
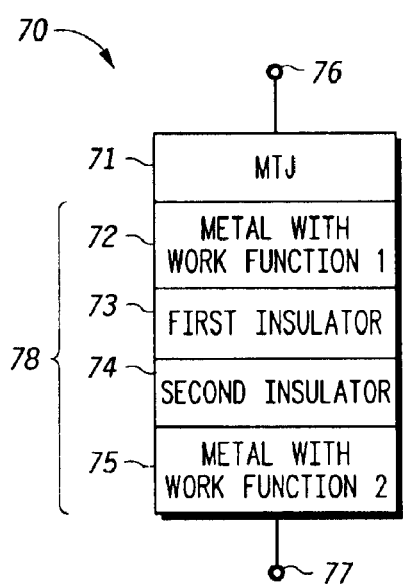
FIG. 7 is a cross section of a memory cell useful in the memory of FIG. 1 according to a second embodiment of the invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A magneto-resistive random access memory (MRAM) uses memory cells connected between rows and columns without requiring a selection transistor. The memory cell comprises a single stack having both a magnetic tunnel junction (MTJ) and an asymmetric device. Because the asymmetric device is conveniently made in the same stack as the MTJ, the addition of the asymmetric device does not sacrifice high density and is achieved with relatively little increased complexity. Being asymmetric, the asymmetric device effectively reduces the parasitic leakage from the unselected cells even with the reverse bias on the asymmetric device of the unselected cells being of a greater magnitude than the forward bias on the asymmetric device of a selected cell. This is better understood with reference to the drawings and the following description.

Shown in FIG. 1 is a memory 10 having an array 12, a row decoder and drivers 14, and a column decoder and sense amplifier 16. Array 12 comprises memory cells 18, 20, 22, and 24, word lines 26 and 28 coupled to row decoder and drivers 14, and bit lines 30 and 32 coupled to column decoder and sense amplifier 16. Memory cells 18–24 have a MTJ with additional features that make it asymmetric in operation. Thus, each cell may be considered an asymmetrical magnetic tunnel junction (AMTJ). Only four memory cells are shown for memory 10 for simplicity, but it is understood that many more cells, word lines, and bit lines would be shown if an entire memory were shown. Cell 18 has an input connected to word line 26 and an output coupled to bit line 30. Cell 20 has an input connected to word line 26 and an output coupled to bit line 32. Cell 22 has an input connected to word line 28 and an output coupled to bit line 30. Cell 24 has an input connected to word line 28 and an output coupled to bit line 32.

In a read operation a bias voltage, for example 500 millivolts (mV), is applied to the selected bit line and ground to the selected word line. The unselected bit lines are at the bias voltage and the unselected word lines are also maintained at the bias voltage, 500 mV. The selected cell then has the bias voltage applied across it. For example, if cell 18 is selected for reading, then word line 26 is grounded, word line 28 is at the bias voltage, bit line 30 is at the bias voltage, and bit line 32 is at the bias voltage. Thus, the selected cell is forward biased from bit line 30 to word line 26, and the state of memory cell 18 is detected based on the current flowing therethrough. The unselected cells are substantially not biased. Cell 24 is substantially not biased with word line 28 at the bias voltage and bit line 32 at the bias voltage. Cell 20 is forward biased with word line 26 grounded and bit line 32 at the bias voltage. Cell 22 is not biased with both word line 28 and bit line 30 at the bias voltage.

Effectively, all of the cells on the selected word line are treated the same. Selection is actually based on which of the bit lines are chosen for sensing. Due to the current through a cell on each bit line, there is some voltage drop on these bit lines. This is made as small as reasonably possible, but it is not zero. Further, the voltage drop on each bit line is somewhat different because the state of the cells on the selected word line is variable from bit line to bit line. Also the voltage on the selected word line is not same for each cell because of current flowing through the word line. This voltage drop is made to be as small as reasonably possible but this drop is also not zero. Due to these voltage drops on the bit lines, unselected cells are also biased. The biasing then generates currents on the unselected word lines. These parasitic currents on the unselected word lines and bit lines degrade to some extent the current on the selected bit line, making it more difficult to accurately detect the state of the cell. Even though these parasitic currents can flow through some forward biased cells, each parasitic path, however, has at least one reverse biased cell in it.

Other alternatives may be used to operate the memory. For example, the unselected bit lines can be left floating instead of being at the bias voltage. The voltage on bit lines would not be truly floating because the memory cells, which are at least a little conductive even in the reverse bias condition, would provide a path to the word lines, which are biased to a specific voltage.

FIG. 2 shows a memory cell 40 for use as memory cells 18–24. Memory cell 40 comprises a stack of layers shown in cross section. The thicknesses are not to scale, but each is of nearly the same lateral dimension. These layers can be etched using a single mask. The top three layers, 42, 44, and 46 comprise a MTJ 54. These three layers 42, 44, and 46 are preferably a ferromagnetic layer, aluminum oxide, and a ferromagnetic layer, respectively and are well known to skilled artisans. These are shown as a free layer 42, a barrier 44, and a fixed layer 46. The fixed layer 46 is a fixed permanent magnet and free layer 42 can be programmed to one magnetic state or another. These two different magnetic states in combination with the barrier and fixed layer result in a variation in resistance that can be measured. In addition to the MTJ 54, the stack has an asymmetric tunnel device 56 comprised of layers 48, 50, and 52. These three layers 48, 50, and 52 are preferably titanium nitride, titanium oxide, and, tantalum respectively. These three materials provide a combination of work functions that result in an asymmetric behavior with respect to application of a voltage. In the forward direction, when layer 52 is biased to a positive voltage, e.g., the bias voltage of 500 mV, with respect to layer 48, the current is about 100 times the current that flows when the same magnitude of bias voltage is applied in the reverse direction. This was analyzed with respect to a 256×256 memory and the result was only a 5% reduction in sensing signal compared to that of a single memory cell that is not part of an array.

Shown in FIGS. 3, 4, and 5 are energy band diagrams that illustrate the origin of the asymmetric conduction mechanism. The difference in work function between insulator 50 and layer 48 is shown as barrier height $\Phi_{M1}$ in FIG. 3, which shows the situation in which there is no bias voltage between layers 48 and 52. Similarly the difference in work function between insulator 50 and layer 52 is shown as barrier height $\Phi_{M2}$ in FIG. 3. The materials for layers 48 and 52 and insulator 50 are chosen so that barrier height $\Phi_{M1}$ is much greater than barrier height $\Phi_{M2}$ to achieve the desired asymmetry. FIG. 4 shows the case in which layer 52 is biased to a positive voltage compared to layer 48. This shows the resulting barrier for electrons tunneling from layer 48 to layer 52 is sharply triangular, thereby facilitating electron transport (opposite direction from current flow) from layer 48 to layer 52. Shown in FIG. 5 is the reverse bias condition in which layer 48 is biased to the positive voltage relative to layer 52. In this case the barrier for electron tunneling from layer 52 to layer 48 is limited to direct tunneling due to the square barrier shape. The result is that the electrons tunnel at a rate that is about 100 times less than that for the forward biased condition shown in FIG. 4.

Materials for layer 48, layer 50, and layer 52 are chosen so that the barrier height of layer 48 with respect to layer 50 and the baffler height of layer 52 with respect to layer 50 are both in the range of zero to 0.6 eV. Furthermore, the materials are chosen so that the difference in these two barrier heights is also 0.2 to 0.6 eV. This ensures that even with the small allowed voltages across the MTJs of the cells, there is a two order of magnitude difference between the currents in the forward and reverse bias direction. For this example of layer 48 being titanium nitride, layer 50 being titanium oxide, and layer 52 being tantalum, the barrier height $\Phi_{M1}$ is 0.53 eV and $\Phi_{M2}$ is 0.14 eV so that the barrier height between layers 48 and 52 is 0.39 eV. The thickness of insulator 50 must be such that the forward bias resistance of asymmetric device 56 is preferably less than or equal to the resistance of MTJ 54. It is beneficial that the forward bias resistance of the asymmetric device not make up a high percentage of the total resistance of the cell and also that the reverse bias resistance of the asymmetric device be large in relation to that of the MTJ. The thicknesses of the metal layers are not particularly significant, 100 Angstroms is an effective thickness. The thickness of the insulator layer 50 may be 30 Angstroms for this example. Other insulators that should be effective as substitutes for titanium oxide include strontium titanate, tantalum pentoxide, strontium bismuth tantalate. Other alternatives that meet the above criteria may be used as substitutes for the metal layers as well. Metals that can be effective when properly chosen according to the above criteria include titanium, copper, and iron.

Shown in FIG. 6 is the current versus voltage plot for the forward and reverse bias conditions of asymmetric device 56 for the case in which the resistance of the MTJ and the forward bias resistance of the asymmetric device are equal. In such case the bias condition on the asymmetric device is half that of the total bias on the cell. This voltage is shown as ½ $V_{bias}$ in FIG. 6. Whereas in operation, the reverse bias condition results in a very small current, even if the reverse bias is a full $V_{bias}$ which explains, even with all of the various leakage paths, the parasitic current degraded the actual cell current by only 5% for a 256×256 array.

Shown in FIG. 7 is an alternative memory cell 70 having a MTJ 71 and an asymmetric device 78 comprising a metal layer 72 under MTJ 71, an insulator layer 73 under layer 72, an insulator layer 74 under layer 73, and a metal layer 75 under layer 74. In this case insulator layers 73 and 74 have a barrier heights and thicknesses that can be selected to provide an even greater difference between forward and reverse currents. An effective example for layers 72, 73, 74, and 75 is titanium nitride, tantalum pentoxide, titanium oxide, and tantalum respectively. The thickness of the metal layers is not particularly significant, 100 Angstroms thickness would be effective. Insulator layer 73 has a barrier height with respect to the metal layers 72 and 75 that is greater than the barrier height of insulator layer 74 with respect to these same metals. Using a relatively small thickness for insulator layer 73, for example 20 Angstroms, and a relatively large thickness for layer 74, for example 100 Angstroms, generates asymmetric behavior of current flow in response to an applied voltage. For the case in which terminal 77 is positive with respect to terminal 76 (forward bias), electrons tunnel through the layer 72 in a manner analogous to that shown in FIG. 4. Also the voltage differential is chosen to be sufficient that under this bias, insulator 74 does not present a barrier to electron flow because the electron energy is greater than the conduction band energy insulator 74. In the opposite direction, with terminal 76 positive with respect to terminal 77 (reverse bias), insulator layer 74 provides a barrier to electron tunneling. Although the barrier is relatively low, the thickness is relatively large so that even this low barrier greatly restricts the number of electrons that can tunnel. In addition, these electrons lack the energy required to cross the high barrier presented by insulator layer 73 as well. This results in much less reverse bias current compared to forward bias current.

Figure 8:
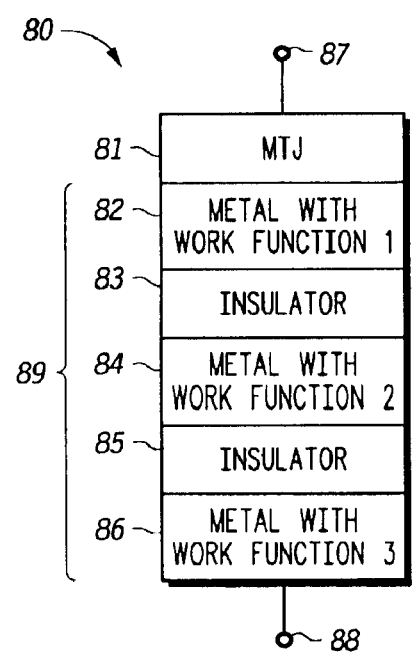
FIG. 8 is a cross section of a memory cell useful in the memory of FIG. 1 according to a third embodiment of the invention.

Shown in FIG. 8 is another alternative memory cell 80 having a MTJ 81 and an asymmetric device 89 comprising a metal layer 82 under MTJ 81, an insulator layer 83 under metal layer 82, a metal layer 84 under insulator layer 83, an insulator layer 85 under metal layer 84, and a metal layer 86 under insulator layer 85. This has the effect of multiplying two asymmetric devices together. The preferred approach is to have a relatively high barrier through insulator 83 in the forward direction so that any electrons passing that barrier will also pass through the relatively low barrier through insulator 85. In the reverse direction, the combined effect of the two barriers is virtually impenetrable. An effective example for layers 82, 83, 84, 85 and 86 are titanium nitride, tantalum pentoxide, titanium, titanium oxide, and tantalum respectively. For this particular example, the barrier height from titanium nitride to tantalum pentoxide is 0.89 eV, the barrier height from titanium to tantalum pentoxide is 0.57 ev, the barrier height from titanium to titanium oxide is 0.21 ev and the barrier height from tantalum to titanium oxide is 0.14 eV. The thickness of the metal layers is not particularly significant. For example, 100 Angstroms would be effective. The insulator thicknesses of about 30 Angstroms would be effective.

In the foregoing specification, the invention has been described with reference to specific embodiments. However, one of ordinary skill in the art appreciates that various modifications and changes can be made without departing from the scope of the present invention as set forth in the claims below. For example, the asymmetric devices 56, 78, and 82 can be on the other side of MTJs, 54, 71, and 81, respectively. Similarly, the metals can be reversed so that the forward and reverse directions are interchanged. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A non-volatile memory cell comprising:
   a magnetic tunnel junction (MTJ) storage element having at least a first ferromagnetic layer, an insulating layer and a second ferromagnetic layer; and
   an asymmetric tunnel device connected in series with the MTJ storage element, the asymmetric tunnel device being asymmetric by conducting electrons in a forward biased direction at a significantly higher rate than in a reversed biased direction.

2. The non-volatile memory cell of claim 1 wherein the asymmetric tunnel device is a metal-insulator-metal (MIM) device.

3. The non-volatile memory cell of claim 1 wherein the asymmetric tunnel device is a metal-insulator-metal-insulator-metal (MIMIM) device.

4. The non-volatile memory cell of claim 1 wherein the asymmetric tunnel device is a metal-insulator-insulator-metal (MIIM) device.

5. The non-volatile memory cell of claim 1 wherein the asymmetric tunnel device further comprises a first layer separated from a second layer by an insulator, the first layer comprising a first material having a first work function and the second layer comprising a second material having a second work function, the first work function differing from a second work function in a range from substantially 0.20 eV to 0.6 eV, and a barrier height between each of the first material and the second material to the insulator is in a range from substantially 0.0 eV to 0.6 eV.

6. The non-volatile memory cell of claim 1 wherein forward biased tunneling conduction of the asymmetric tunnel device is at least ten times greater than reverse biased tunneling conduction of the asymmetric tunnel device when the non-volatile memory cell is biased at substantially plus and minus one-half volt, respectively.

7. The non-volatile memory cell of claim 1 wherein the first ferromagnetic layer, the insulating layer and the second ferromagnetic layer of the MTJ storage element are stacked and the asymmetric tunnel device is stacked with the MTJ storage element.

8. The non-volatile memory cell of claim 7 wherein the first ferromagnetic layer, the insulating layer and the second ferromagnetic layer of the MTJ storage element are stacked above the asymmetric tunnel device.

9. The non-volatile memory cell of claim 1 wherein the asymmetric tunnel device comprises a first layer of tantalum, a second layer of titanium oxide and a third layer of titanium nitride.

10. The non-volatile memory cell of claim 1 wherein the asymmetric tunnel device comprises a first layer of tantalum, a second layer comprising at least one of strontium titanate, tantalum pentoxide and strontium bismuth tantalate ($SrBi_2Ta_2O_9$) and a third layer of titanium nitride.

11. A non-volatile memory array comprising:
    a plurality of bit lines;
    a plurality of word lines;
    an array of memory cells, each of the memory cells being formed at an intersection of a predetermined one of the plurality of bit lines and the plurality of word lines;
    a row decoder and drivers coupled to each of the plurality of word lines for decoding a memory address and selecting a predetermined word line in response;
    a column decoder coupled to each of the plurality of bit lines for decoding the memory address and selecting a predetermined bit line in response;
    each of the memory cells comprising:
      a magnetic tunnel junction (MTJ) storage element having at least a first ferromagnetic layer, an insulating layer and a second ferromagnetic layer; and
      an asymmetric tunnel device formed in a stack with the MTJ storage element, the asymmetric tunnel device being asymmetric by conducting electrons in a forward biased direction at a significantly higher rate than in a reversed biased direction.

12. The non-volatile memory array of claim 11 wherein the asymmetric tunnel device comprises a first layer separated from a second layer by an insulator, the first layer comprising a first material having a first work function and the second layer comprising a second material having a second work function, the first work function differing from a second work function in a range from substantially 0.20 eV to 0.6 eV, and a barrier height between each of the first material and the second material to the insulator being in a range from substantially 0.0 eV to 0.6 eV.

13. The non-volatile memory array of claim 12 wherein the first layer comprises tantalum (Ta), the second layer comprises titanium nitride (TiN) and the insulator comprises titanium oxide ($TiO_2$).

14. The non-volatile memory array of claim 11 wherein the asymmetric tunnel device comprises one of a metal-insulator-metal (MIM) device, a metal-insulator-metal-insulator-metal (MIMIM) device and a metal-insulator-insulator-metal (MIIM) device.

15. The non-volatile memory array of claim 11, wherein the memory cell has a first terminal coupled to the MTJ on a first end of the stack and a second terminal on a second end of the stack, and wherein the asymmetric tunnel device comprises:
   a first metal layer adjacent to the MTJ and in the stack;
   a second metal layer in the stack and coupled to the second terminal; and
   a first insulator layer in the stack between the first and second metal layer.

16. The non-volatile memory of claim 15, wherein the asymmetric tunnel device further comprises a second insulator layer in the stack between the first insulator layer and the second metal layer.

17. The non-volatile memory of claim 16, wherein the asymmetric tunnel device further comprises a third metal layer in the stack between the first and second insulator layers.

18. The non-volatile memory of claim 17, wherein the first and second insulators have different work functions.

\* \* \* \* \*